(12) United States Patent
Eid et al.

(10) Patent No.: US 11,302,599 B2
(45) Date of Patent: Apr. 12, 2022

(54) HEAT DISSIPATION DEVICE HAVING A THERMALLY CONDUCTIVE STRUCTURE AND A THERMAL ISOLATION STRUCTURE IN THE THERMALLY CONDUCTIVE STRUCTURE

(71) Applicant: Intel Corporation, Santa Clara, CA (US)

(72) Inventors: Feras Eid, Chandler, AZ (US); Adel Elsherbini, Chandler, AZ (US); Johanna Swan, Scottsdale, AZ (US)

(73) Assignee: Intel Corporation, Santa Clara, CA (US)

(*) Notice: Subject to any disclaimer, the term of this patent is extended or adjusted under 35 U.S.C. 154(b) by 845 days.

(21) Appl. No.: 15/957,437

(22) Filed: Apr. 19, 2018

(65) Prior Publication Data

US 2019/0326192 A1    Oct. 24, 2019

(51) Int. Cl.
| | |
|---|---|
| *H01L 23/367* | (2006.01) |
| *H01L 23/498* | (2006.01) |
| *H01L 23/00* | (2006.01) |
| *H01L 25/065* | (2006.01) |
| *H01L 25/00* | (2006.01) |

(Continued)

(52) U.S. Cl.
CPC ...... *H01L 23/3675* (2013.01); *H01L 21/4853* (2013.01); *H01L 21/4871* (2013.01); *H01L 23/13* (2013.01); *H01L 23/49838* (2013.01); *H01L 24/16* (2013.01); *H01L 24/24* (2013.01); *H01L 25/0652* (2013.01); *H01L 25/0655* (2013.01); *H01L 25/50* (2013.01); *H01L 2224/16155* (2013.01); *H01L 2224/24145* (2013.01); *H01L 2225/06517* (2013.01);
(Continued)

(58) Field of Classification Search
CPC ............ H01L 21/4871; H01L 21/4882; H01L 23/367; H01L 23/3675; H01L 23/49838; H01L 24/16; H01L 24/24; H01L 25/0652; H01L 25/0655; H01L 25/50; H01L 2225/06589

See application file for complete search history.

(56) References Cited

U.S. PATENT DOCUMENTS

| | | | |
|---|---|---|---|
| 5,745,344 A * | 4/1998 | Baska | H01L 21/4871 165/185 |
| 6,625,025 B1 * | 9/2003 | Duxbury | H01L 23/367 165/185 |

(Continued)

*Primary Examiner* — Allan R Wilson
(74) *Attorney, Agent, or Firm* — Essential Patents Group, LLP.

(57) ABSTRACT

A heat dissipation device may be formed as a thermally conductive structure having at least one thermal isolation structure extending at least partially through the thermally conductive structure. The heat dissipation device may be thermally connected to a plurality of integrated circuit devices, such that the at least one thermal isolation structure is positioned between at least two integrated circuit devices. The heat dissipation device allows for heat transfer away from each of the plurality of integrated circuit devices, such as in a z-direction within the thermally conductive structure, while substantially preventing heat transfer in either the x-direction and/or the y-direction within the thermally isolation structure, such that thermal cross-talk between integrated circuit devices is reduced.

21 Claims, 6 Drawing Sheets

(51) Int. Cl.
*H01L 21/48* (2006.01)
*H01L 23/13* (2006.01)
(52) U.S. Cl.
CPC ............ *H01L 2225/06548* (2013.01); *H01L 2225/06555* (2013.01); *H01L 2225/06589* (2013.01)

(56) References Cited

U.S. PATENT DOCUMENTS

| | | | | |
|---|---|---|---|---|
| 2007/0289127 | A1* | 12/2007 | Hurwitz | H05K 3/4697 29/827 |
| 2009/0279218 | A1* | 11/2009 | Ferru | H01L 25/167 361/56 |
| 2013/0203218 | A1* | 8/2013 | Bayerer | H01L 25/50 438/121 |
| 2017/0162550 | A1* | 6/2017 | Das | H01L 23/5329 |
| 2018/0141098 | A1* | 5/2018 | Fabischek | B21D 22/208 |
| 2019/0323785 | A1* | 10/2019 | Eid | H01L 23/3677 |
| 2019/0385933 | A1* | 12/2019 | Eid | H01L 23/3677 |

* cited by examiner

HEAT DISSIPATION DEVICE HAVING A THERMALLY CONDUCTIVE STRUCTURE AND A THERMAL ISOLATION STRUCTURE IN THE THERMALLY CONDUCTIVE STRUCTURE

TECHNICAL FIELD

Embodiments of the present description generally relate to the removal of heat from integrated circuit devices, and, more particularly, to a heat dissipation device, having a thermally conductive structure with thermal isolation portions formed therein, which is used to remove heat from a plurality of integrated circuit devices.

BACKGROUND

Higher performance, lower cost, increased miniaturization of integrated circuit components, and greater packaging density of integrated circuits are ongoing goals of the integrated circuit industry. As these goals are achieved, integrated circuit devices become smaller. Accordingly, the density of power consumption of the components in the integrated circuit devices has increased, which, in turn, increases the average junction temperature of the integrated circuit device. If the temperature of the integrated circuit device becomes too high, the integrated circuits may be damaged or destroyed. This issue becomes even more critical when multiple integrated circuit devices are incorporated in a single integrated circuit package. In such a configuration, heat is generally removed from the multiple integrated circuit devices with a single thermally conductive heat dissipation device, such as a heat spreader. However, differing integrated circuit devices within the integrated circuit package may have differing operating temperatures. Thus, a high heat generating integrated circuit device may dominate the heat transferred into the thermally conductive heat dissipation device, which may hamper the transfer of heat into the thermally conductive heat dissipation device by other integrated circuit devices in the integrated circuit package, e.g. thermal cross-talk. As such, the other integrated circuit devices may exceed their temperature limits and be damaged or destroyed, leading to the failure of the entire integrated circuit package.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DESCRIPTION OF EMBODIMENTS

Figure 1:
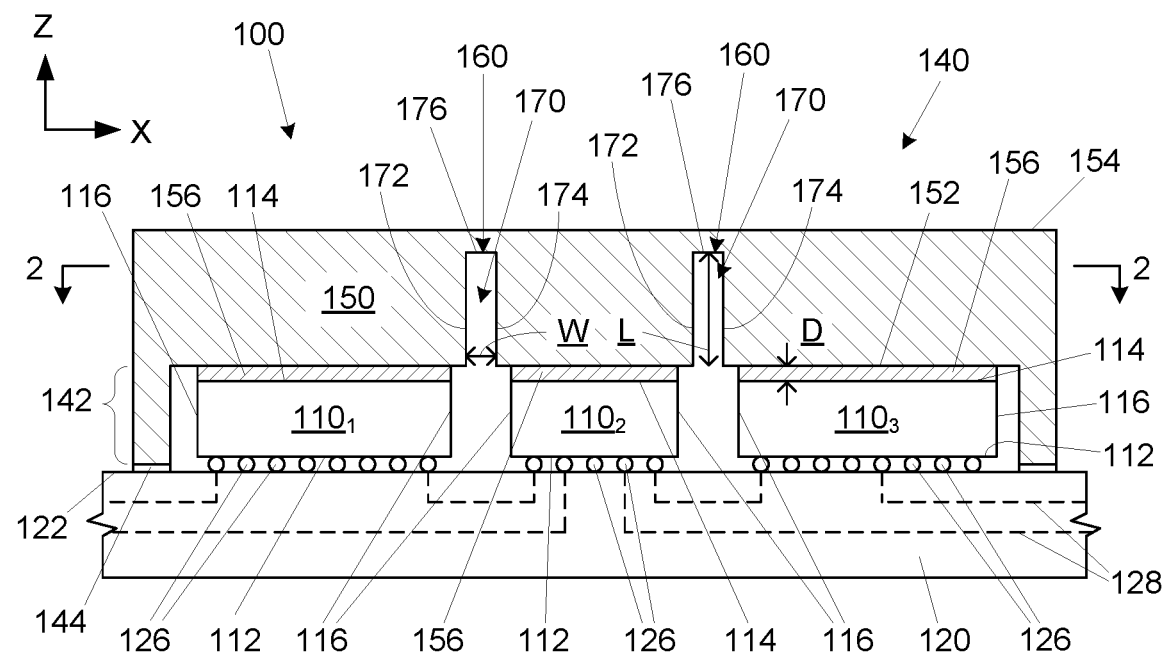
FIG. 1 is a side cross-sectional view of an integrated circuit package including a heat dissipation device comprising a thermally conductive structure having at least one thermal isolation structure extending into the heat dissipation device, wherein the thermal isolation structure comprises a trench, according to one embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present invention. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The term "package" generally refers to a self-contained carrier of one or more dice, where the dice are attached to the package substrate, and may be encapsulated for protection, with integrated or wire-boned interconnects between the dice and leads, pins or bumps located on the external portions of the package substrate. The package may contain a single die, or multiple dice, providing a specific function. The package is usually mounted on a printed circuit board for interconnection with other packaged integrated circuits and discrete components, forming a larger circuit.

Here, the term "cored" generally refers to a substrate of an integrated circuit package built upon a board, card or wafer comprising a non-flexible stiff material. Typically, a small printed circuit board is used as a core, upon which integrated circuit device and discrete passive components may be soldered. Typically, the core has vias extending from one side to the other, allowing circuitry on one side of the core to be coupled directly to circuitry on the opposite side of the core. The core may also serve as a platform for building up layers of conductors and dielectric materials.

Here, the term "coreless" generally refers to a substrate of an integrated circuit package having no core. The lack of a core allows for higher-density package architectures. as the through-vias have relatively large dimensions and pitch compared to high-density interconnects.

Here, the term "land side", if used herein, generally refers to the side of the substrate of the integrated circuit package closest to the plane of attachment to a printed circuit board, motherboard, or other package. This is in contrast to the term "die side", which is the side of the substrate of the integrated circuit package to which the die or dice are attached.

Here, the term "dielectric" generally refers to any number of non-electrically conductive materials that make up the structure of a package substrate. For purposes of this disclosure, dielectric material may be incorporated into an integrated circuit package as layers of laminate film or as a resin molded over integrated circuit dice mounted on the substrate.

Here, the term "metallization" generally refers to metal layers formed over the dielectric material of the package substrate. The metal layers are generally patterned to form metal structures such as traces and bond pads. The metallization of a package substrate may be confined to a single layer or in multiple layers separated by layers of dielectric.

Here, the term "bond pad" generally refers to metallization structures that terminate integrated traces and vias in integrated circuit packages and dies. The term "solder pad" may be occasionally substituted for "bond pad" and carries the same meaning.

Here, the term "solder bump" generally refers to a solder layer formed on a bond pad. The solder layer typically has a round shape, hence the term "solder bump".

Here, the term "substrate" generally refers to a planar platform comprising dielectric and metallization structures. The substrate mechanically supports and electrically couples one or more IC dies on a single platform, with encapsulation of the one or more IC dies by a moldable dielectric material. The substrate generally comprises solder bumps as bonding interconnects on both sides. One side of the substrate, generally referred to as the "die side", comprises solder bumps for chip or die bonding. The opposite side of the substrate, generally referred to as the "land side", comprises solder bumps for bonding the package to a printed circuit board.

Here, the term "assembly" generally refers to a grouping of parts into a single functional unit. The parts may be separate and are mechanically assembled into a functional unit, where the parts may be removable. In another instance, the parts may be permanently bonded together. In some instances, the parts are integrated together.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, magnetic or fluidic connection between the things that are connected or an indirect connection, through one or more passive or active intermediary devices.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile" and "plan" correspond to orthogonal planes within a cartesian coordinate system. Thus, cross-sectional and profile views are taken in the x-z plane, and plan views are taken in the x-y plane. Typically, profile views in the x-z plane are cross-sectional views. Where appropriate, drawings are labeled with axes to indicate the orientation of the figure.

Embodiments of the present description may include a heat dissipation device, comprising a thermally conductive structure having at least one thermal isolation structure extending at least partially through the thermally conductive structure. The heat dissipation device may be thermally connected to a plurality of integrated circuit devices such that the at least one thermal isolation structure is positioned between at least two integrated circuit devices. In one embodiment, the thermally conductive structure allows for heat transfer away from each of the plurality of integrated circuit devices, such as in a z-direction, while the thermal isolation structure substantially prevents heat transfer in the x-direction and/or the y-direction, such that thermal cross-talk between integrated circuit devices is reduced.

In the production of integrated circuit packages, integrated circuit devices are generally mounted on substrates, which provide electrical communication routes between the integrated circuit devices and with external components. As shown in FIG. 1, an integrated circuit package 100 may comprise a plurality of integrated circuit devices (illustrated as elements $110_1$, $110_2$, and $110_3$), such as microprocessors, chipsets, graphics devices, wireless devices, memory devices, application specific integrated circuits, combinations thereof, stacks thereof, or the like, attached to a first surface 122 of a substrate 120, such as an interposer, a printed circuit board, a motherboard, and the like, through a plurality of interconnects 126, such as reflowable solder bumps or balls, in a configuration generally known as a flip-chip or controlled collapse chip connection ("C4") configuration. The device-to-substrate interconnects 126 may extend from bond pads (not shown) on a first surface 112 of each of the integrated circuit devices $110_1$, $110_2$, and $110_3$ and bond pads (not shown) on the substrate first surface 122. The integrated circuit device bond pads (not shown) of each of the integrated circuit devices $110_1$, $110_2$, and $110_3$ may be in electrical communication with circuitry (not shown) within the integrated circuit devices $110_1$, $110_2$, and $110_3$. The substrate 120 may include at least one conductive route 128 extending therethrough to form electrical connections from at least one integrated circuit device $110_1$, $110_2$, and $110_3$ to external components (not shown) and/or between at least two of the integrated circuit devices $110_1$, $110_2$, and $110_3$.

The substrate 120 may be primarily composed of any appropriate dielectric material, including, but not limited to, bismaleimine triazine resin, fire retardant grade 4 material, polyimide materials, glass reinforced epoxy matrix material, and the like, as well as laminates or multiple layers thereof. The substrate conductive routes 128 may be composed of any conductive material, including but not limited to metals, such as copper and aluminum, and alloys thereof. As will be understood to those skilled in the art, the substrate conductive routes 128 may be formed as a plurality of conductive traces (not shown) formed on layers of dielectric material (constituting the dielectric material of the substrate 120), which are connected by conductive vias (not shown). Furthermore, the substrate 120 may be either a cored or a coreless substrate.

The device-to-substrate interconnects 126 can be made of any appropriate material, including, but not limited to, solders materials. The solder materials may be any appropriate material, including but not limited to, lead/tin alloys, such as 63% tin/37% lead solder, and high tin content alloys (e.g. 90% or more tin), such as tin/bismuth, eutectic tin/silver, ternary tin/silver/copper, eutectic tin/copper, and similar alloys. When the integrated circuit devices $110_1$, $110_2$, and $110_3$ are attached to the substrate 120 with device-to-substrate interconnects 126 made of solder, the solder is reflowed, either by heat, pressure, and/or sonic energy to secure the solder between the integrated circuit devices $110_1$, $110_2$, and $110_3$ and the substrate 120.

As further illustrated in FIG. 1 and according to one embodiment of the present description, a heat dissipation device 140 may be thermally coupled with the second surfaces 114 (opposing the first surfaces 112) of the integrated circuit devices $110_1$, $110_2$, and $110_3$. The heat dissipation device 140 may comprise a thermally conductive structure 150 having a first surface 152 and an opposing second surface 154, and at least one thermal isolation structure 160 extending into the thermally conductive structure 150 from the first surface 152 thereof. In one embodiment of the present description, the thermal isolation structure 160 may comprise a trench 170. In an embodiment of the present description, the trench 170 may not extend entirely through the thermally conductive structure 150. In one embodiment illustrated in FIG. 1, the trench 170 may be defined by at least two sidewalls 172 and 174 and at least one surface 176 extending between the sidewalls 172 and 174. The trench 170 may be formed by any technique known in the art, including, but not limited to stamping, skiving, molding, and the like. It is understood that the trench 170 may be formed during the formation of the heat dissipation device 140 or after the fabrication of the heat dissipation device 140. It is further understood that a length L (e.g. length of sidewalls 172 and 174) and a width W (e.g. distance between sidewalls 172 and 174) may be adjusted to achieve a desired thermal performance of the heat dissipation device 140.

In one embodiment, the thermal isolation structure 160 may be positioned between adjacent integrated circuit devices (shown between integrated circuit devices $110_1$ and $110_2$, and between integrated circuit devices $110_2$ and $110_3$), but, of course, offset from the integrated circuit devices $110_1$, $110_2$, and $110_3$ in the z-direction. The positioning of the thermal isolation structures 160 allows for heat transfer away from each of the plurality of integrated circuit devices, such as in a z-direction within the thermally conductive structure 150, while substantially preventing heat transfer in either the x-direction and/or the y-direction (see FIG. 2) between integrated circuit devices $110_1$, $110_2$, and $110_3$, such that thermal cross-talk between integrated circuit devices $110_1$, $110_2$, and $110_3$ is reduced.

In the embodiment illustrated in FIG. 1, the trench 170 may be unfilled, such that the ambient atmosphere, which has low thermal conductivity (e.g. air at room temperature (25 degrees Celsius) has a thermal conductivity of about 0.026 W/m*K), acts as a thermal insulator between portions of the thermally conductive structure 150 on opposing sides of the trench 170. For the purposes of the present description, the term "thermally non-conductive", "thermally insulative", "thermal insulator" and/or "thermal insulator material" means a structure or material having a thermal conductivity "k" of about 1.0 W/m*K or less.

The thermally conductive structure 150 may be made of any appropriate thermally conductive material. In one embodiment of the present description, the thermally conductive structure 150 may be made of at least one metal material, alloys of more than one metal, and combinations thereof, including, but not limited to, copper, nickel, aluminum, alloys, laminated metals including coated materials (such as nickel coated copper), and the like. In another embodiment of the present description, the thermally conductive structure 150 may be made of non-metallic, thermally conductive materials, such as graphite. For the purposes of the present description, the term "thermally conductive structure" and/or "thermally conductive material", as it relates to the thermally conductive structure 150, means a structure or material having a thermal conductivity "k" of about 10 W/m*K or greater.

A thermal interface material 156, such as a grease or polymer having an enhanced thermal conductivity, may be disposed between the first surface 152 of the thermally conductive structure 150 and a second surface 114 (opposing the first surface 112) of each integrated circuit device $110_1$, $110_2$, and $110_3$ to facilitate heat transfer therebetween, to compensate for tolerances, and/or to compensate for any height (z-direction) differences between the integrated circuit device $110_1$, $110_2$, and $110_3$. The thermal interface material 156 may have an enhanced thermal conductivity "k" of about 2 to 3 W/m*K.

Figure 2:
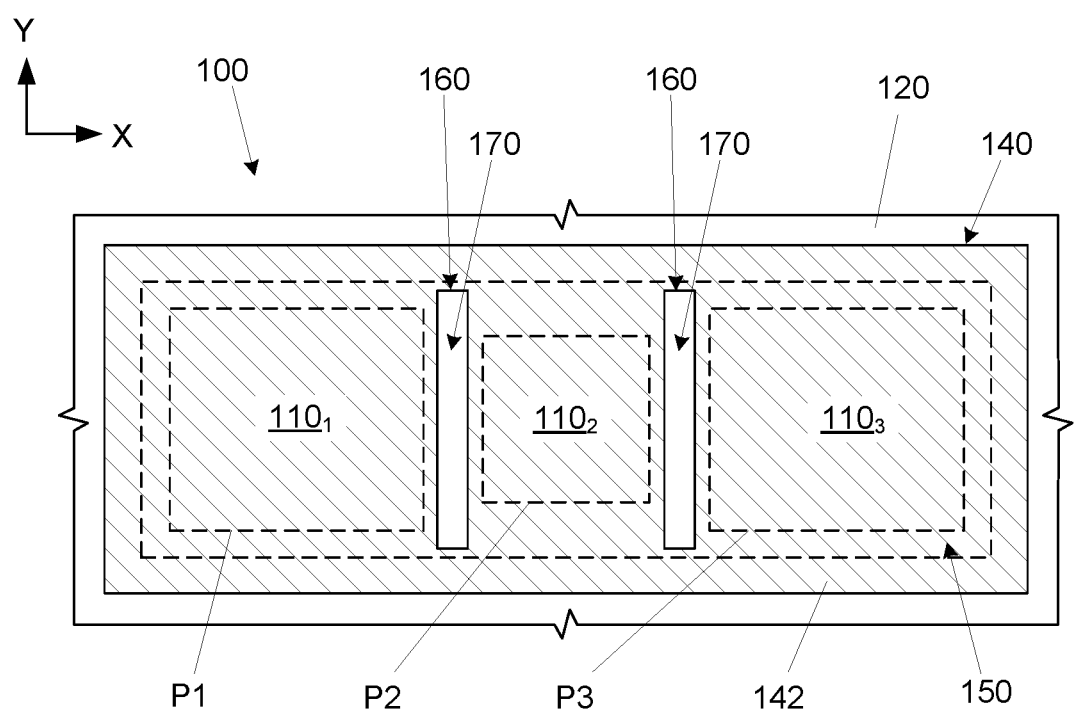
FIGS. 2-4 are cross-sectional views along line 2-2 of FIG. 1 of various configurations of the thermal isolation structures, according to various embodiments of the present description.

In one embodiment of the present description, the heat dissipation device 140 may include at least one footing 142 extending between the first surface 152 of the thermally conductive structure 150 and the first surface 122 of the substrate 120, wherein the heat dissipation device footing 142 may be attached to the substrate first surface 122 with an attachment adhesive or sealant layer 144. As illustrated in FIG. 1, the footing 142 may be a single material with the thermally conductive structure 150, such as where the thermally conductive structure 150 and the footing 142 are formed substantially simultaneously by a single process step, including but not limited to stamping, skiving, molding, and the like. In various embodiments, the footing 142 may be a plurality of walls, pillars, or the like, or may be a single "picture frame" structure surrounding the integrated circuit devices $110_1$, $110_2$, and $110_3$, as illustrated in FIG. 2. The attachment adhesive or sealant layer 144 may be any appropriate material, including, but not limited to, silicones (such as polydimethylsiloxane), epoxies, and the like. It is understood that the footing 142 not only secures the heat dissipation 140 to the substrate 120, but also maintains the desired distance D between the first surface 152 of the thermally conductive structure 150 of the heat dissipation device 140 and the second surfaces 114 of at least one of the integrated circuit devices $110_1$, $110_2$, and $110_3$, usually measured from highest integrated circuit device when their heights vary. This distance may be referred to as the "bond line thickness".

It is understood that the second surface 154 of the thermally conductive structure 150 of the heat dissipation device 140 may be in thermal contact with an additional heat dissipation device (not shown), including but not limited to a heat pipe, a high surface area dissipation structure (such as a structure having fins or pillars/columns formed in a thermally conductive structure), a liquid cooling device, and the like, which may assist in removing heat from the heat dissipation device 140, as will be understood to those skilled in the art.

It is further understood that an underfill material (not shown), such as an epoxy material, may be disposed between the integrated circuit devices $110_1$, $110_2$, and $110_3$ and the substrate first surface 122, and surrounding the plurality of interconnects 126. The underfill material (not shown) may provide structural integrity and may prevent contamination, as will be understood to those skilled in the art.

FIG. 2 illustrates a cross-sectional view along line 2-2 of FIG. 1, wherein the integrated circuit devices $110_1$, $110_2$, and $110_3$ are shown in shadow lines for clarity. As shown in FIG. 2, each of the integrated circuit devices $110_1$, $110_2$, and $110_3$ may have a periphery P1, P2, P3, respectively, which is defined by the sidewalls 116 (see FIG. 1) of each of the integrated circuit devices $110_1$, $110_2$, and $110_3$. In one embodiment, as shown in FIG. 2, the thermal isolation structure 160 may comprise single, straight trenches 170 (extending in the y-direction) between adjacent integrated circuit devices (shown between integrated circuit devices $110_1$ and $110_2$, and between integrated circuit devices $110_2$ and $110_3$), such that the trenches are external to any of the peripheries P1, P2, P3, of the integrated circuit devices $110_1$, $110_2$, and $110_3$, respectively.

Figure 3:
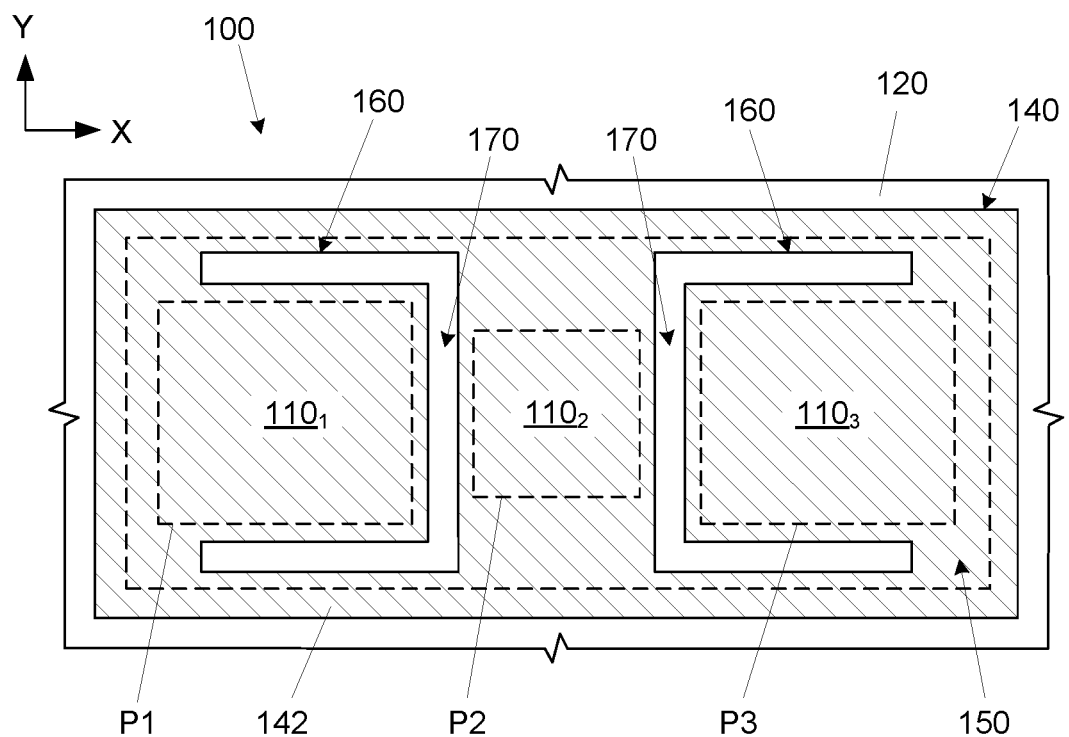
Figure 4:
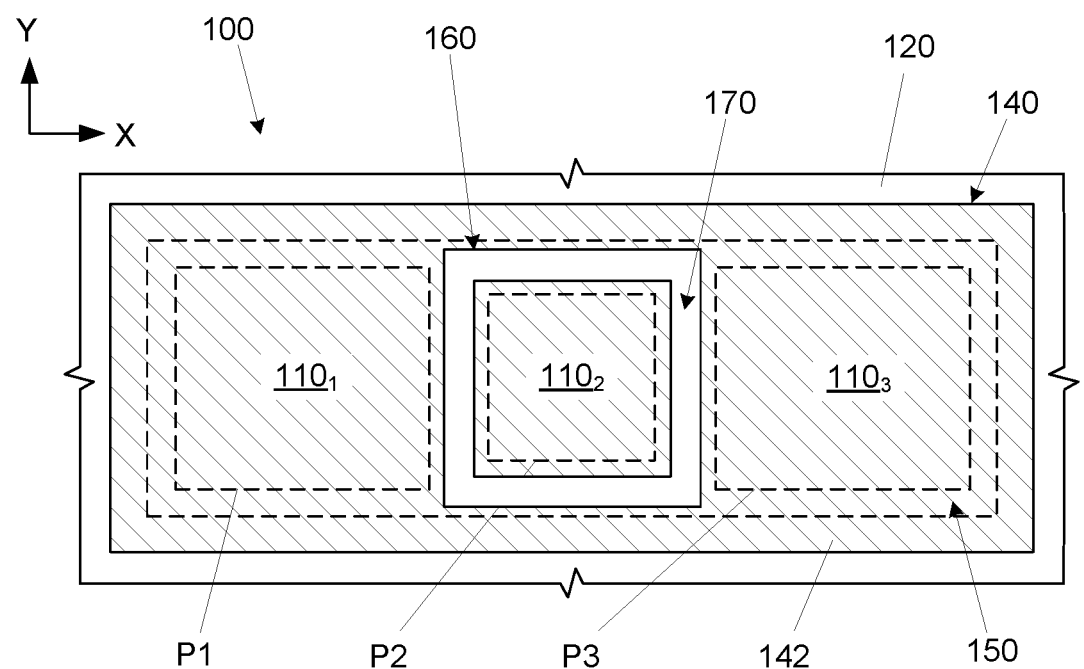

It is understood that the thermal isolation structures 160 may have any appropriate configuration to most effectively reduce thermal cross-talk between any of the integrated circuit devices $110_1$, $110_2$, and $110_3$. In another embodiment, as shown in FIG. 3, the thermal isolation structures 160 may comprise trenches 170 extending in both the x-direction and the y-direction. In a further embodiment, as shown in FIG. 4, the thermal isolation structure 160 may comprise a trench 170 extending around at least one periphery P1, P2, P3 of at least one of the integrated circuit devices $110_1$, $110_2$, and $110_3$, respectively (shown in FIG. 4 as surrounding integrated circuit device $110_2$).

Although the embodiments illustrated herein show three integrated circuit devices $110_1$, $110_2$, and $110_3$ aligned in the x-direction, it is understood that any appropriate number of integrated circuit devices may be used in any appropriate configuration in both the x-direction and the y-direction.

Figure 5:
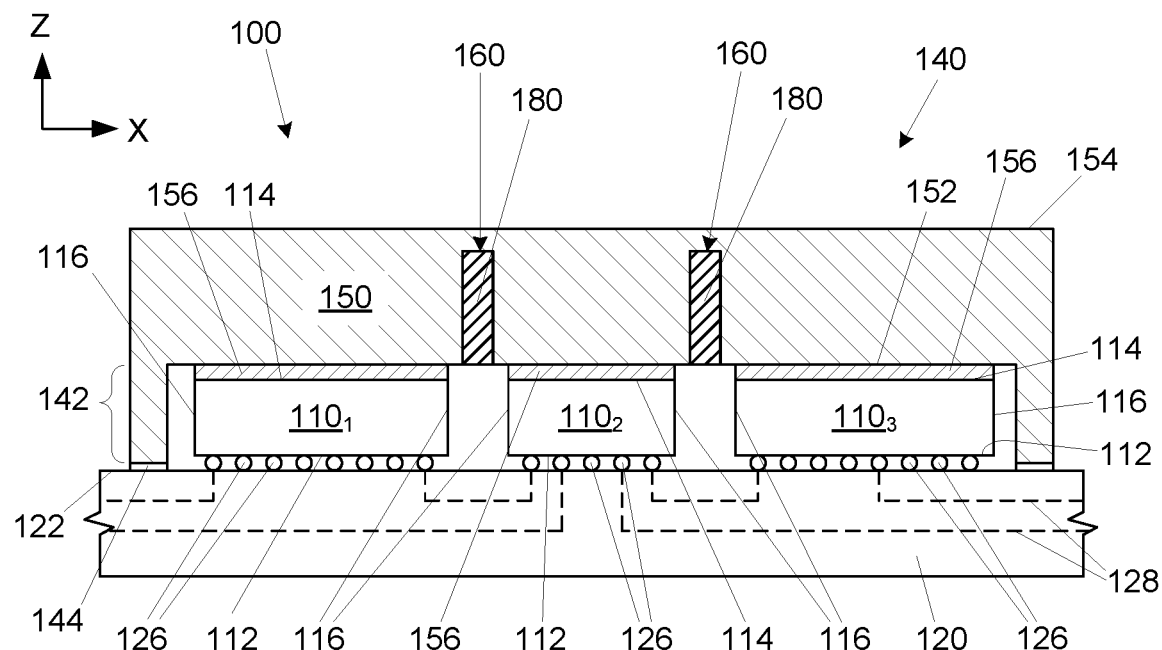
FIG. 5 is a side cross-sectional view of an integrated circuit package including a heat dissipation device comprising a thermally conductive structure having at least one thermal isolation structure extending into the heat dissipation device, wherein the thermal isolation structure comprises a trench filled with a thermally non-conductive material, according to an embodiment of the present description.

In another embodiment of the present description, the trenches 170 of FIG. 1 may have a thermally insulative material 180 therein, as shown in FIG. 5. The use of the thermally insulative material 180 may assist in improving the structural integrity of the heat dissipation device 140 compared to the unfilled embodiment of FIG. 1. The thermally insulative material 180 may be made of any appropriate thermally insulative material, including, but not limited to, low conductivity polymers (such as epoxies and silica-filled epoxies), ceramics, polymer/ceramic composites, and the like.

Figure 6:
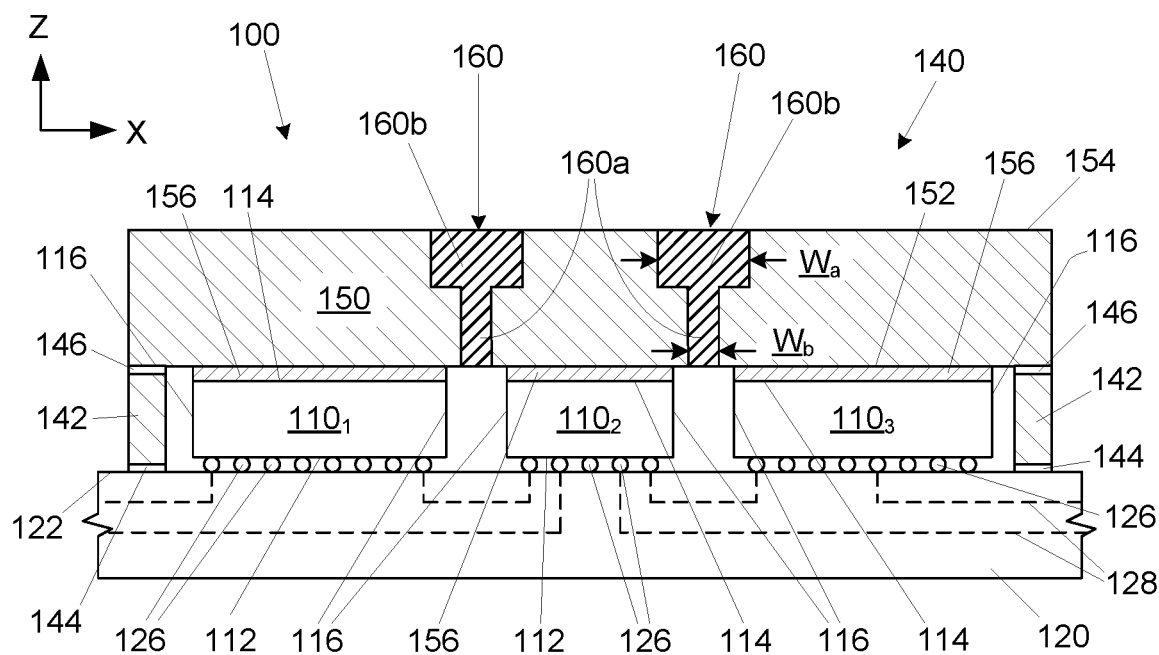
FIG. 6 is a side cross-sectional view of an integrated circuit package including a heat dissipation device comprising a thermally conductive structure having at least one thermal isolation structure extending into the heat dissipation device, wherein the thermal isolation structure comprises a trench filled with a thermally non-conductive material that extends through the thermally conductive structure, according to another embodiment of the present description.

In an embodiment of the present description, as shown in FIG. 6, the thermal isolation structure 160 may extend entirely through the thermally conductive structure 150 from the first surface 152 of the thermally conductive structure 150 to the second surface 154 of the thermally conductive structure 150. Furthermore, the thermal isolation structure 160 may vary in width W (see FIG. 1) as it extends through the thermally conductive structure 150. As illustrated in FIG. 6, an upper portion 160b of the isolation structure 160 may have a width $W_b$ that is greater than a width $W_a$ of the lower portion 160a of the isolation structure. This configuration is merely exemplary of how the shape within the thermally conductive structure 150 can be varied or adjusted to achieve a desired thermal performance for the heat dissipation device 140.

Although the heat dissipation device 140 illustrated in FIG. 1 shows the footing 142 as a single material with the thermally conductive structure 150, the embodiments of the present description are not so limited. As shown in FIG. 6, in further embodiments of the present description, the thermally conductive structure 150 may consist of at least two parts, wherein the thermally conductive structure 150 and the at least one footing 142 are separate parts. As shown, the footing 142 may be attached to the first surface 152 of the thermally conductive structure 150 with an adhesive or sealant layer 146. Although fabricating the heat dissipation device 140 as a multiple piece assembly, e.g. the thermally conductive structure 150 and the footing 142 will take additional assembly steps, it may make the fabrication of the heat dissipation device 140 easier, as a whole. Again, the footing 142 may be a plurality of walls, pillars, or the like, or may be a single "picture frame" structure surrounding the integrated circuit devices $110_1$, $110_2$, and $110_3$. The adhesive or sealant layer 146 may be any appropriate material, including, but not limited to silicones (such as polydimethylsiloxane), epoxies, and the like. In one embodiment, the adhesive or sealant layer 146 may be the same as the attachment adhesive or sealant layer 144.

Figure 7:
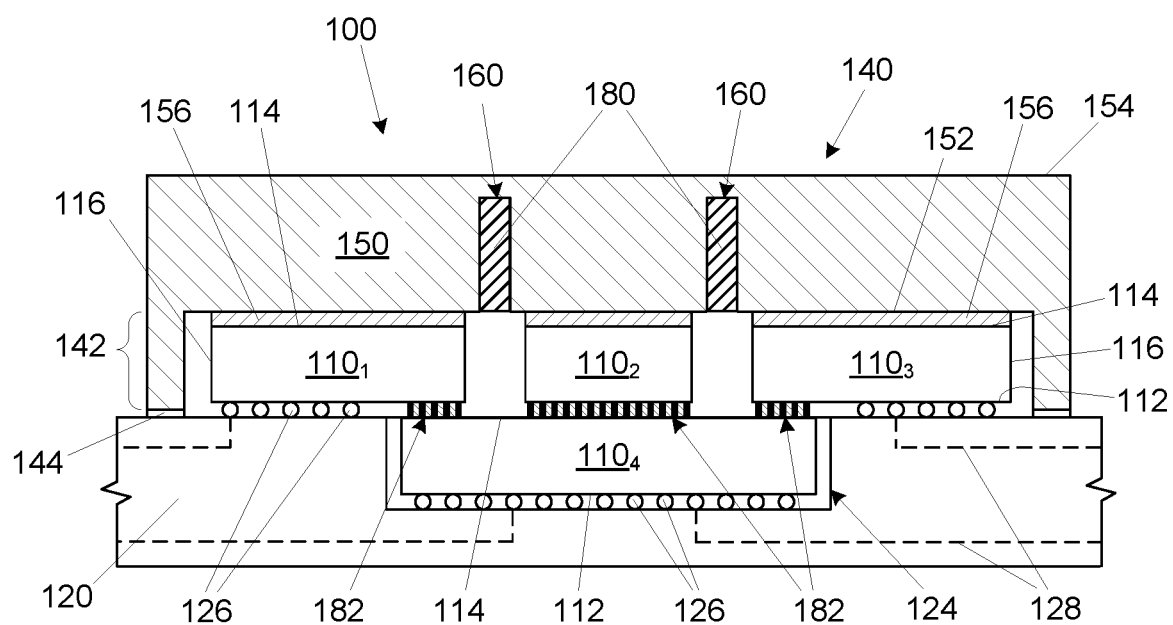
FIG. 7 is a side cross-sectional view of an integrated circuit package including a heat dissipation device comprising a thermally conductive structure having at least one thermal isolation structure, wherein the heat dissipation device is in thermal contact with a stacked integrated circuit device configuration, according to another embodiment of the present description.

Although the illustrations of FIGS. 1-6 show a planar configuration for the integrated circuit devices $110_1$, $110_2$, and $110_3$, various embodiments of the present configuration are not so limited. As shown in FIG. 7, the integrated circuit devices $110_1$, $110_2$, $110_3$, and $110_4$ may be assembled in a stacked configuration. As illustrated, the substrate 120 may include a cavity 124 formed therein and at least one integrated circuit device, illustrated as element $110_4$, may be at least partially disposed in the cavity 124. As with FIG. 1, the integrated circuit device $110_4$ may be electrically attached to the substrate 120 within the cavity 124 through device-to-substrate interconnects 126 extending from the first surface 112 of the integrated circuit $110_4$ and at least one of the integrated circuit devices $110_1$, $110_2$, $110_3$ may be electrically attached to the second surface 114 of integrated circuit device $110_4$, such as with high density interconnects 182, as known in the art, which may be in contact with integrated circuits (not shown) with through-silicon vias (not shown) within the integrated circuit device $110_4$.

Figure 8:
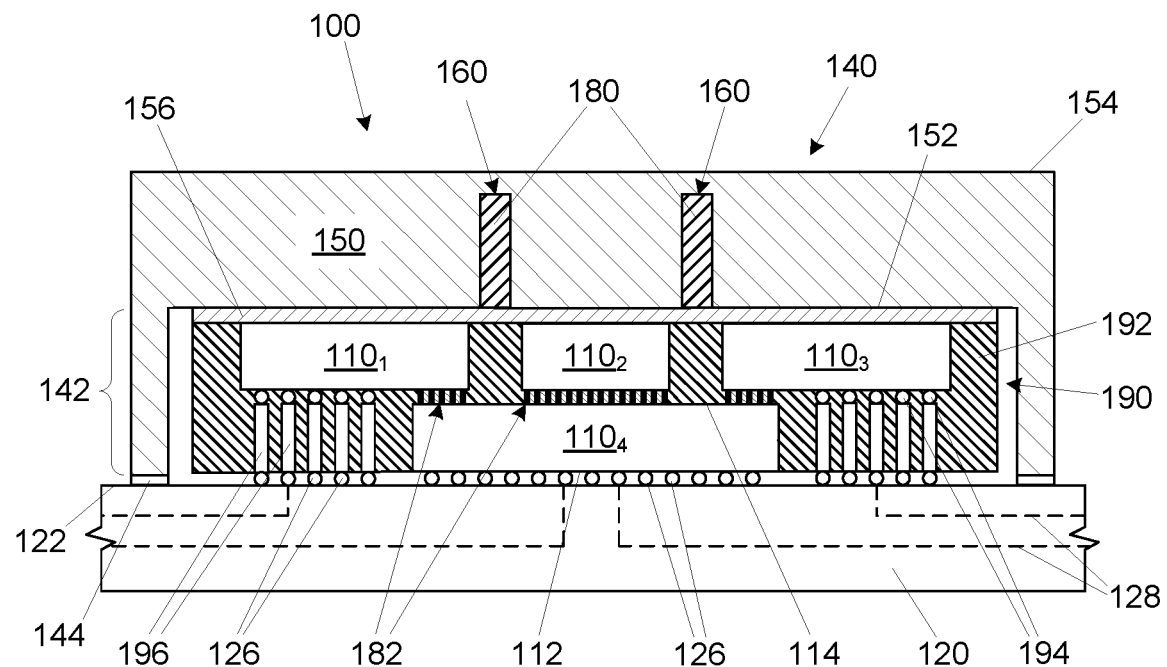
FIG. 8 is a side cross-sectional view of an integrated circuit package including a heat dissipation device comprising a thermally conductive structure having at least one thermal isolation structure, wherein the heat dissipation device is in thermal contact with a stacked integrated circuit device configuration disposed in a mold material, according to another embodiment of the present description.

In a further embodiment shown in FIG. 8, a stack configuration of integrated circuit devices $110_1$, $110_2$, $110_3$, and $110_4$ may be disposed in a mold material 192 to form a molded package 190. As with FIG. 7, the integrated circuit device $110_4$ may be electrically attached to the substrate 120 through device-to-substrate interconnects 126 from the first surface 112 of the integrated circuit $110_4$ and at least one of the integrated circuit devices $110_1$, $110_2$, $110_3$ may be electrically attached to the second surface 114 of integrated circuit device $110_4$, such as with high density interconnects 182, which may be in contact with integrated circuits (not shown) with through-silicon vias (not shown) within the integrated circuit device $110_4$. At least one of the integrated circuit devices (illustrated as elements $110_1$ and $110_3$) may be electrically attached to the substrate 120 through device-to-substrate interconnects 126 which are electrically attached to through-mold interconnects 196 and device interconnect 194 within the molded package 190. The processes for the fabrication of a molded package 190 are well known in the art and for purposes of brevity and conciseness will not be described herein.

Figure 9:
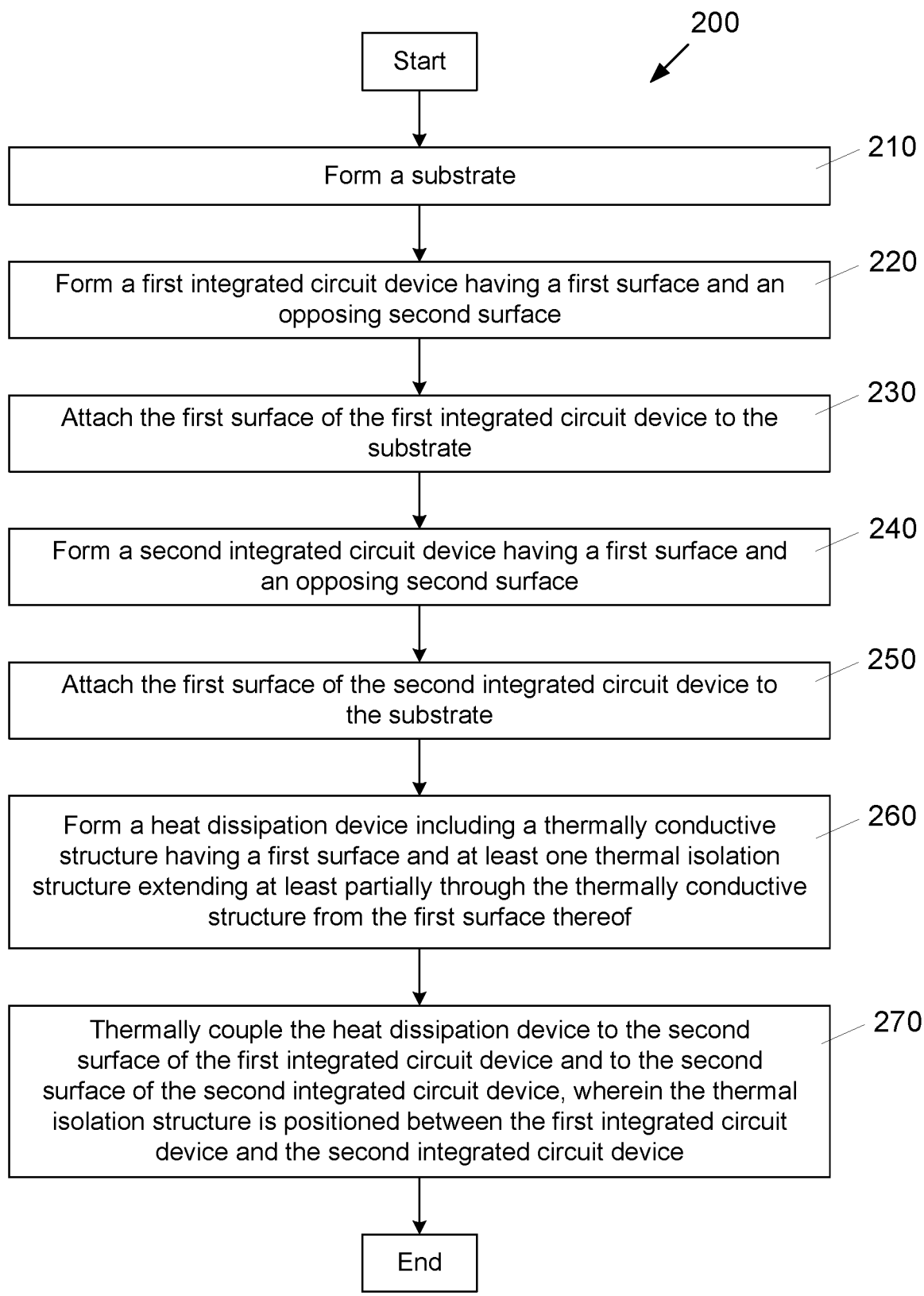
FIG. 9 is a flow chart of a process for fabricating an integrated circuit package, according to the present description.

FIG. 9 is a flow chart of a process 200 of fabricating an integrated circuit structure according to an embodiment of the present description. As set forth in block 210, a substrate may be formed. A first integrated circuit device may be formed having a first surface and an opposing second surface, as set forth in block 220. As set forth in block 230, the first surface of the first integrated circuit device may be attached to the substrate. A second integrated circuit device may be formed having a first surface and an opposing second surface, as set forth in block 240. As set forth in block 250, the first surface of the second integrated circuit device may be attached to the substrate. A heat dissipation device may be formed including a thermally conductive structure having a first surface and at least one thermal isolation structure extending at least partially through the thermally conductive structure from the first surface thereof, as set forth in block 260. As set forth in block 270, the heat dissipation device may be thermally coupled to the second surface of the first integrated circuit device and to the second surface of the second integrated circuit device, wherein the thermal isolation structure is positioned between the first integrated circuit device and the second integrated circuit device.

Figure 10:
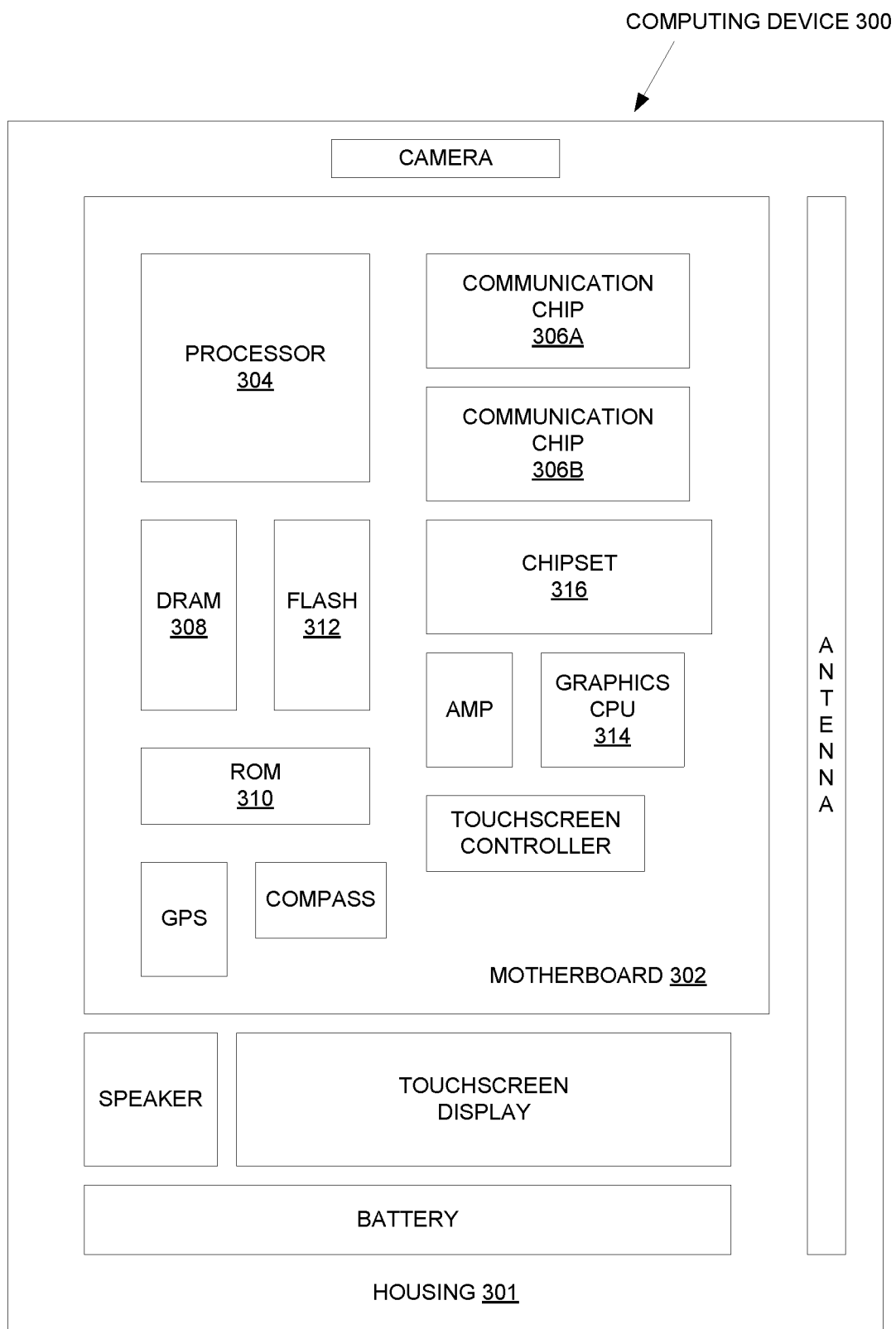
FIG. 10 is an electronic device/system, according to an embodiment of the present description.

FIG. 10 illustrates an electronic or computing device 300 in accordance with one implementation of the present description. The computing device 300 may include a housing 301 has a board 302 disposed therein. The board 302 may include a number of integrated circuit components, including but not limited to a processor 304, at least one communication chip 306A, 306B, volatile memory 308 (e.g., DRAM), non-volatile memory 310 (e.g., ROM), flash memory 312, a graphics processor or CPU 314, a digital signal processor (not shown), a crypto processor (not shown), a chipset 316, an antenna, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker, a camera, and a mass storage device (not shown) (such as hard disk drive, compact disk (CD), digital versatile disk (DVD), and so forth). Any of the integrated circuit components may be physically and electrically coupled to the board 302. In some implementations, at least one of the integrated circuit components may be a part of the processor 304.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

At least one of the integrated circuit components may include a thermal solution comprising a heat dissipation device, comprising a thermally conductive structure having a first surface and at least one thermal isolation structure extending at least partially through the thermally conductive structure from the first surface thereof, as described in the present description.

In various implementations, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-10. The subject matter may be applied to other integrated circuit devices and assembly applications, as well as any appropriate electronic application, as will be understood to those skilled in the art.

Having thus described in detail embodiments of the present invention, it is understood that the invention defined by the appended claims is not to be limited by particular details set forth in the above description, as many apparent variations thereof are possible without departing from the spirit or scope thereof

What is claimed is:

1. An integrated circuit structure, comprising:
a substrate;
a first integrated circuit device having a first surface and an opposing second surface, wherein the first surface of the first integrated circuit device is electrically attached to the substrate;
a second integrated circuit device having a first surface and an opposing second surface, wherein the first surface of the second integrated circuit device is electrically attached to the substrate;
a heat dissipation device thermally coupled to the second surface of the first integrated circuit device and the second surface of the second integrated circuit device, wherein the heat dissipation device comprises a thermally conductive structure having a first surface and an opposing second surface, and at least one thermal isolation structure extending partially through the thermally conductive structure from the first surface thereof without extending to the opposing second surface thereof, and wherein the thermal isolation structure is positioned between the first integrated circuit device and the second integrated circuit device.

2. The integrated circuit structure of claim 1, wherein the at least one thermal isolation structure comprises at least one trench extending partially through the thermally conductive structure.

3. The integrated circuit structure of claim 2, further comprising a thermally non-conductive material in the at least one trench.

4. The integrated circuit structure of claim 3, wherein the thermally non-conductive material is selected from the group consisting of epoxies, ceramics, and composites of polymers and ceramics.

5. The integrated circuit structure of claim 1, further comprising a third integrated circuit device having a first surface and an opposing second surface, wherein the third integrated circuit is in a stacked configuration with the first integrated circuit and the second integrated circuit, wherein the first surface of the third integrated circuit device is electrically attached to the substrate, and wherein at least one of the first integrated circuit device and the second integrated circuit device is electrically connected to the third integrated circuit device.

6. The integrated circuit structure of claim 5, wherein the substrate further includes a cavity and wherein the third integrated circuit is disposed at least partially in the cavity.

7. The integrated circuit structure of claim 5, wherein the first integrated circuit device, the second integrated circuit device, and the third integrated circuit device are embedded in a mold material.

8. An electronic system, comprising:
a housing;
a board in the housing;
a first integrated circuit device having a first surface and an opposing second surface, wherein the first surface of the first integrated circuit device is electrically attached to the board;
a second integrated circuit device having a first surface and an opposing second surface, wherein the first surface of the second integrated circuit device is electrically attached to the board;
a heat dissipation device thermally coupled to the second surface of the first integrated circuit device and the second surface of the second integrated circuit device, wherein the heat dissipation device comprises a thermally conductive structure having a first surface and an opposing second surface, and at least one thermal isolation structure extending partially through the thermally conductive structure from the first surface thereof without extending to the opposing second surface thereof, and wherein the thermal isolation structure is positioned between the first integrated circuit device and the second integrated circuit device.

9. The electronic system of claim 8, wherein the at least one thermal isolation structure comprises at least one trench extending partially through the thermally conductive structure.

10. The electronic system of claim 9, further comprising a thermally non-conductive material in the at least one trench.

11. The electronic system of claim 10, wherein the thermally non-conductive material is selected from the group consisting of epoxies, ceramics, and composites of polymers and ceramics.

12. The electronic system of claim 8, further comprising a third integrated circuit device having a first surface and an opposing second surface, wherein the third integrated circuit is in a stacked configuration with the first integrated circuit and the second integrated circuit, wherein the first surface of the third integrated circuit device is electrically attached to the board, and wherein at least one of the first integrated circuit device and the second integrated circuit device is electrically connected to the third integrated circuit device.

13. The electronic system of claim 12, wherein the board further includes a cavity and wherein the third integrated circuit is disposed at least partially in the cavity.

14. The electronic system of claim 12, wherein the first integrated circuit device, the second integrated circuit device, and the third integrated circuit device are embedded in a mold material.

15. A method of forming an integrated circuit structure, comprising:
forming a substrate;
forming a first integrated circuit device having a first surface and an opposing second surface;
electrically attaching the first surface of the first integrated circuit device to the substrate;
forming a second integrated circuit device having a first surface and an opposing second surface
electrically attaching the first surface of the second integrated circuit device to the substrate;
forming a heat dissipation device comprising a thermally conductive structure having a first surface and an opposing second surface, and at least one thermal isolation structure extending partially through the thermally conductive structure from the first surface thereof without extending to the opposing second surface thereof; and
thermally coupling the heat dissipation device to the second surface of the first integrated circuit device and to the second surface of the second integrated circuit device wherein the thermal isolation structure is positioned between the first integrated circuit device and the second integrated circuit device.

16. The method of claim 15, wherein the at least one thermal isolation structure is formed from at least one trench extending partially through the thermally conductive structure.

17. The method of claim 16, further comprising disposing a thermally non-conductive material in the at least one trench.

18. The method of claim 17, wherein disposing the thermally non-conductive material comprises disposing a material selected from the group consisting of epoxies, ceramics, and composites of polymers and ceramics.

19. The method of claim 15, further comprising:
   forming a third integrated circuit device having a first surface and an opposing second surface;
   positioning the third integrated circuit in a stacked configuration with the first integrated circuit and the second integrated circuit;
   electrically attaching the first surface of the third integrated circuit device to the substrate; and
   electrically connecting at least one of the first integrated circuit device and the second integrated circuit device to the third integrated circuit device.

20. The method of claim 19, wherein forming the substrate further includes forming a cavity therein; and further comprising disposing at least a portion of the third integrated circuit device in the cavity.

21. The method of claim 19, further comprising embedding the first integrated circuit device, the second integrated circuit device, and the third integrated circuit device in a mold material.

* * * * *